(12) United States Patent
Tesdahl et al.

(10) Patent No.: US 6,998,849 B2
(45) Date of Patent: Feb. 14, 2006

(54) CAPACITIVE SENSOR MEASUREMENT METHOD FOR DISCRETE TIME SAMPLED SYSTEM FOR IN-CIRCUIT TEST

(75) Inventors: Curtis A. Tesdahl, Fort Collins, CO (US); Ronald J. Peiffer, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 55 days.

(21) Appl. No.: 10/672,804

(22) Filed: Sep. 27, 2003

(65) Prior Publication Data

US 2005/0068051 A1    Mar. 31, 2005

(51) Int. Cl.
G01R 31/08    (2006.01)
G01R 31/02    (2006.01)

(52) U.S. Cl. .................................. 324/519; 324/754
(58) Field of Classification Search .............. 324/754, 324/755, 761, 765, 512, 519, 527, 537; 714/25, 714/736, 737, 819
See application file for complete search history.

(56) References Cited

U.S. PATENT DOCUMENTS

| | | | |
|---|---|---|---|
| 4,488,301 A * | 12/1984 | Nasuta et al. ............... | 714/736 |
| 4,709,366 A * | 11/1987 | Scott et al. .................... | 714/46 |
| 5,254,953 A | 10/1993 | Crook et al. | |
| 5,274,336 A | 12/1993 | Crook et al. | |
| 5,381,417 A | 1/1995 | Loopik et al. | |
| 5,498,964 A | 3/1996 | Kerschner et al. | |
| 5,557,209 A | 9/1996 | Crook et al. | |
| 5,696,451 A | 12/1997 | Keirn et al. | |
| 5,786,697 A * | 7/1998 | Khazam et al. ............. | 324/537 |

OTHER PUBLICATIONS

Dixon, R.C., "Spread Spectrum Systems", Wiley-Interscience, 1976, pp. 1-27 (Month Unavailable).
Higgins, Richard J., "Digital Signal Processing in VLSI", Prentice Hall, 1990, pp. 69-72 (Month Unavailable).

* cited by examiner

Primary Examiner—Vinh Nguyen
Assistant Examiner—Russell M. Kobert

(57) ABSTRACT

Disclosed is a novel method and apparatus for acquiring multiple capacitively sensed measurements from a circuit under test. Multiple digital sources are respectively connected to stimulate multiple respective first ends of multiple respective nets of interest. Respective second ends of the multiple respective nets of interest are capacitively sensed. The respective capacitively coupled signals are digitally sampled and shift correlated with respective expected digital signatures. If a high level of correlation is found for a given net, the net is electrically intact; otherwise, the net is characterized by either an open or some other fault that prevents it from meeting specification.

6 Claims, 12 Drawing Sheets

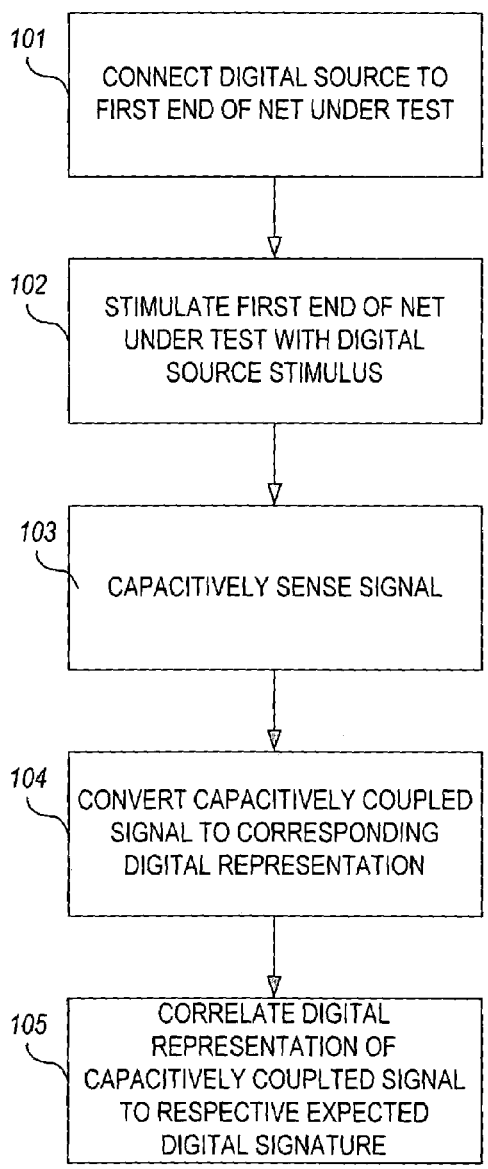
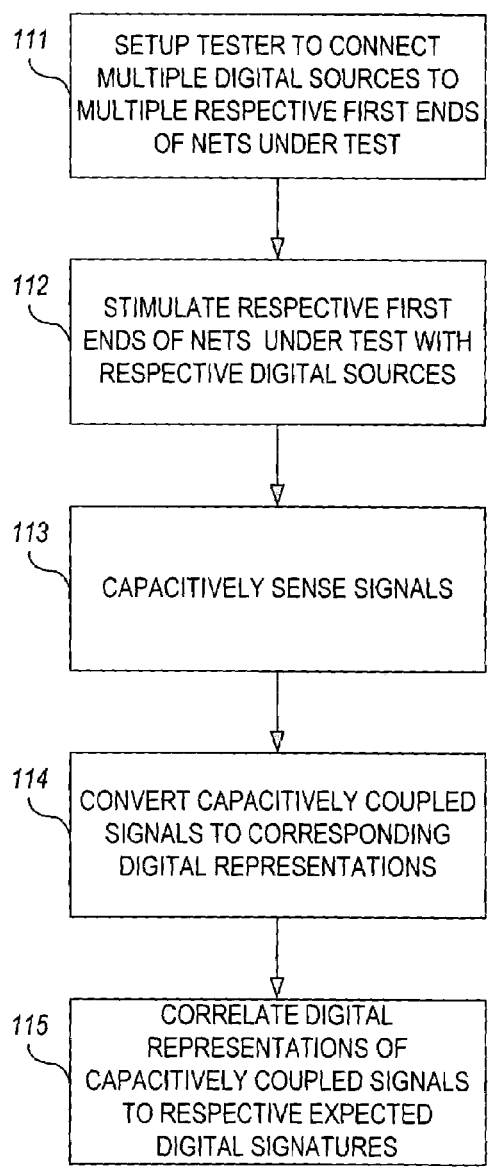
FIG. 8
FIG. 14

CAPACITIVE SENSOR MEASUREMENT METHOD FOR DISCRETE TIME SAMPLED SYSTEM FOR IN-CIRCUIT TEST

BACKGROUND OF THE INVENTION

Obtaining electrical measurements from nodes of an electrical device via a capacitive sensing probe is often performed during the testing of a printed circuit board. As known in the art, capacitive sensing is a technique often used in determining the electrical connectivity of pins, nodes, traces, and other electrical conductors. See, for example, U.S. Pat. No. 5,696,431, Identification of Pin-Open Faults By Capacitive Coupling to Keirn et al., U.S. Pat. No. 5,498,964, Capacitive Electrode System for Detecting Open Solder Joints in Printed Circuit Assemblies, to Kerschner et al., U.S. Pat. No. 5,254,953 to Crook et al., U.S. Pat. No. 5,241,336 to Crook et al., and U.S. Pat. No. 5,357,209 to Crook et al., all of which are incorporated by reference herein for all that they teach.

For purposes of clarity, the description herein will use the following terminology. As termed herein:

A "net" is an electrically conductive path between two endpoints.

A "test access point" or "test point" is a location on a printed circuit board where an external device (e.g., a probe) electrically physically contacts a point on a net.

A printed circuit board (PCB) "pad" is a location on a PCB where an integrated circuit lead or electrical component lead is electrically connected to the PCB. (The connection between the lead and pad is typically made via an integrated circuit/component pin that is connected to the pin within the integrated circuit/component package and solder between the pin and pad).

FIG. 1 shows a test configuration illustrating a prior art capacitive sensing technique for determining the integrity of the electrically connectivity of an integrated circuit pin to a net. As illustrated, the test configuration utilizes a capacitive sensing probe 2. The capacitive sensing probe 2 includes a metallic electrode that is positioned over the integrated circuit package 4 of an integrated circuit in close proximity to a lead conductor 7 that is connected to an integrated circuit pin 6 inside the integrated circuit package 4. An oscillator 8 supplies an alternating current signal, typically eight kilohertz (8 KHz) at 100 mV. The output of the oscillator 8 is connected to a net 12 (which may be a wire, a trace, a solder bump, or any other known conductive material, and/or combination thereof) at a first end 12a. The net 12 is connected at a second end 12b to the integrated circuit pin 6, which is connected to lead conductor 7.

To perform a test, the integrated circuit pin 6 is stimulated (through net 12) by the AC signal generated by the oscillator 8. If the net 12 between end 12a at the output of the oscillator 8 and end 12b at the integrated circuit pin 6 is electrically intact, and the net 12 is electrically connected to the pin 6, the AC signal applied at the first end 12a of the net 12 will appear on the integrated circuit pin 6 and conductive lead 7, where it will be capacitively coupled through the integrated circuit package to the capacitive sensing probe 2. The capacitive sensing probe returns the capacitively coupled signal to a measurement circuit 14. The measurement circuit 14 includes a phase synchronous voltmeter 10 that receives the AC source signal 5 from the oscillator 8 and the capacitively coupled signal 3 from the probe 3. The phase synchronous voltmeter 10 attempts to phase synchronize the capacitively coupled signal 3 with the AC source signal 5. The voltmeter 10 measures not only the amplitude of the capacitively coupled signal 3 from the probe 3 but also its phase relative to the source signal 5. The voltmeter rejects noise by integrating the signal over multiple cycles of the source frequency. Phase information is used to differentiate between capacitive, resistive, and inductive impedances.

If the amplitude of the measured impedances falls within a predetermined acceptable range (as calculated based on the board design or as obtained from measurements from a known good board), the integrated circuit pin 6 is considered to be properly electrically connected (e.g., soldered, wire-bonded, etc.).

Open circuits are a common defect in the manufacture of PCB assemblies, typically occurring as a result of poor solder bonds, incomplete traces, and/or missing devices that are either never loaded onto the board or which fall off during the assembly process. The capacitive sensing technique is often used in PCB testers for detecting open connections on a PCB assembly. A PCB tester typically includes a number of tester interface pins that are arranged on a face of the tester in a predefined configuration. Because the positions of the tester interface pins are unchangeable, a test fixture customized to the particular design of the PCB under test is typically required to interface between the tester interface pins of the tester and test points on the PCB under test. The test fixture includes circuitry (e.g., wires, probes) that electrically connects various tester interface pins on the tester to various test access points on the PCB under test.

Test access points of interest may be stimulated by an AC source in the tester. In this regard, the AC source in the tester may be connected to various tester interface pins via configurable relays within the tester. Thus, stimulation of a given test access point may therefore be achieved by configuring the relays to connect the AC source to a given tester interface pin that connects to the test access point of interest on the PCB via the test fixture. By design, the test access point on a PCB should be connected to a component under test (e.g., and integrated circuit pin) via a net. The electrically integrity of the net and net-to-component connection may be tested by using the capacitive sensing technique previously described.

In large testers, the number of available AC reference sources may be limited. Thus, testing of a complete PCB may require many relay configuration cycles in order to connect each of the nets under test to an available AC source. As known in the art, the relay configuration and settling time can take a significant amount of time relative to the time required to obtain the capacitively coupled measurement. Since a PCB can contain hundreds or thousands or more nets and net-to-component connections to be tested, this relay configuration procedure can prove to be too costly in terms of test time when only a limited number of AC sources are available for net stimulation.

It will be recognized that although the availability of many, or even multiple, AC sources in a large tester is often limited or non-existent, in such testers there is often a proliferation of digital sources available due to the use of the tester in performing digital functional tests. When configuring the tester for digital functional test, the tester often has the ability to connect all or many of its tester interface pins to a corresponding digital source in the tester in a nearly one-to-one mapping. Thus, all relay connections could be performed in parallel and the configuration time could be reduced to the relay settling time of the slowest relay if the digital sources could be used in place of the AC source(s) of the tester. However, because the digital sources generate no phase information, in the past digital sources have not been used to obtain capacitively sensed measurements because the digital sources cannot be phase synchronized with the capacitively coupled signal. It would therefore be desirable to have a method that would allow the use of ubiquitously available digital sources in a printed circuit board tester to allow faster acquisition of multiple capacitively sensed measurements.

SUMMARY OF THE INVENTION

The present invention is a novel technique for allowing the acquisition of multiple capacitively sensed measurements that utilizes tester hardware for generating digital stimulation signals, tester pins for delivering the stimulation signals to nodes of interest on the PCB under test, and digital signal processing (DSP) correlation and detection functionality from which the presence or absence of electrical connectivity between two nodes of interest can be derived. In accordance with a preferred embodiment of the invention, the capacitive sensing technique involves the steps of: for each of a plurality of nodes of interest on a PCB under test, stimulating a first end of a net under test with a known signal, capacitively sensing a signal on a component that should be connected to the net at a second end of the net, correlating the capacitively sensed signal with the known signal, and determining whether the level of correlation meets a pre-determined level of correlation.

The invention advantageously allows the use of digital stimulation sources due to the fact that it does not utilize specific phase information (which is unavailable for digital tester sources) to correlate the capacitively coupled signal with the source signal. Because the digital stimulation signal utilizes a known pattern, the sensed signal can be correlated with the stimulation signal based on pattern recognition rather than specific phase information. Another advantage of the invention is that by allowing the use of ubiquitously available digital stimulation sources normally used for functional test in the tester, the setup time for the acquisition of multiple capacitively sensed measurements is significantly decreased.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIG. 8 is a flowchart illustrating a method for performing a test for detecting open or sub-specification conditions of a net under test;

FIG. 14 is a flowchart illustrating another alternative method for performing a test for detecting open or sub-specification conditions of a net under test;

DETAILED DESCRIPTION

A novel technique for acquiring multiple capacitively sensed measurements from a circuit under test is described in detail hereinafter. Although the invention is described in terms of specific illustrative embodiments, it is to be understood that the embodiments described herein are by way of example only and that the scope of the invention is not intended to be limited thereby.

Figure 1:
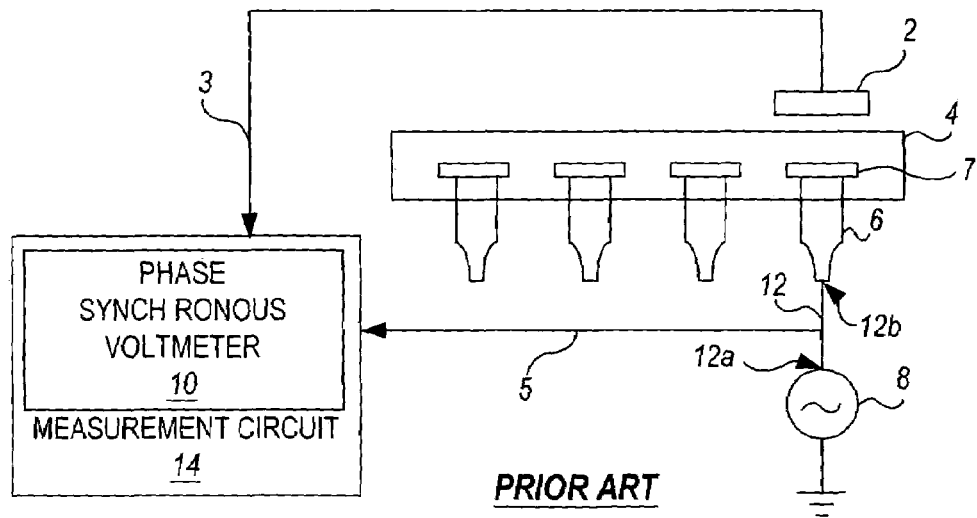
FIG. 1 is a schematic block diagram illustrating the prior art test configuration for acquiring capacitive sensor measurement.
Figure 2:
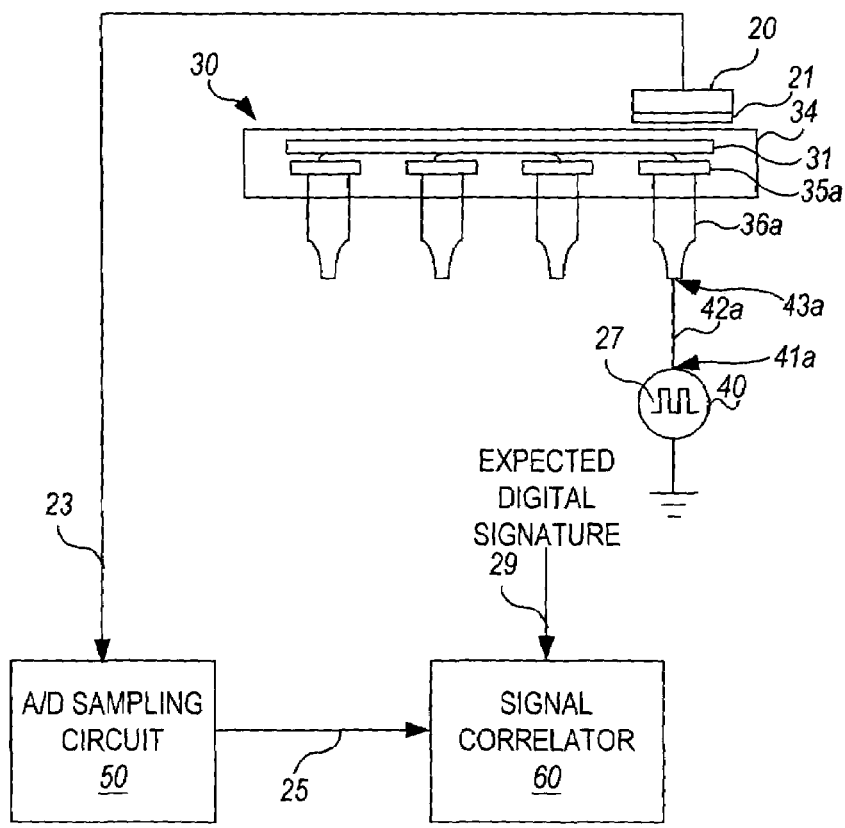
FIG. 2 is a schematic block diagram illustrating a first embodiment of a test configuration implemented in accordance with the invention for acquiring a capacitive sensor measurement without specific phase information.

Turning now to the invention, FIG. 2 is a schematic block diagram of a first embodiment of a test configuration for acquiring capacitively sensed measurements implemented according to the invention. In this configuration, a capacitive sensing probe 20 comprising a metallic electrode 21 is placed on top of the package 34 of an integrated circuit chip 30. A net 42a (which may be a wire, a trace, a solder bump, or any other known conductive material, and/or combination thereof) is characterized by a first end 41a connected to the output of an oscillating digital source 40 and a second end 43a connected to a pin 36a of the integrated circuit chip 30.

Digital square-wave source 40 generates a reference signal (or "stimulus") 27. Analog-to-digital (A/D) sampling circuit 50 is connected to receive a capacitively coupled signal 23 sensed by probe 20. The sampling circuit 50 samples at least two times (2×) the frequency of the reference signal 27. In the preferred embodiment, the sampling rate is ten times (10×) the frequency of the reference signal 27 to allow a good representation 25 of the signal 23. Once a digital representation 25 of the signal 23 is captured, a correlation function 60 performs a correlation algorithm to correlate the sampled signal 25 with an expected digital signature 29 (i.e., the digital signal of the reference signal 27). Since the digital signature (i.e., pattern) of the reference signal 27 is known, no phase information is required. The correlation results are indicative of the integrity of the net and net-to-pin connection.

Figure 3:
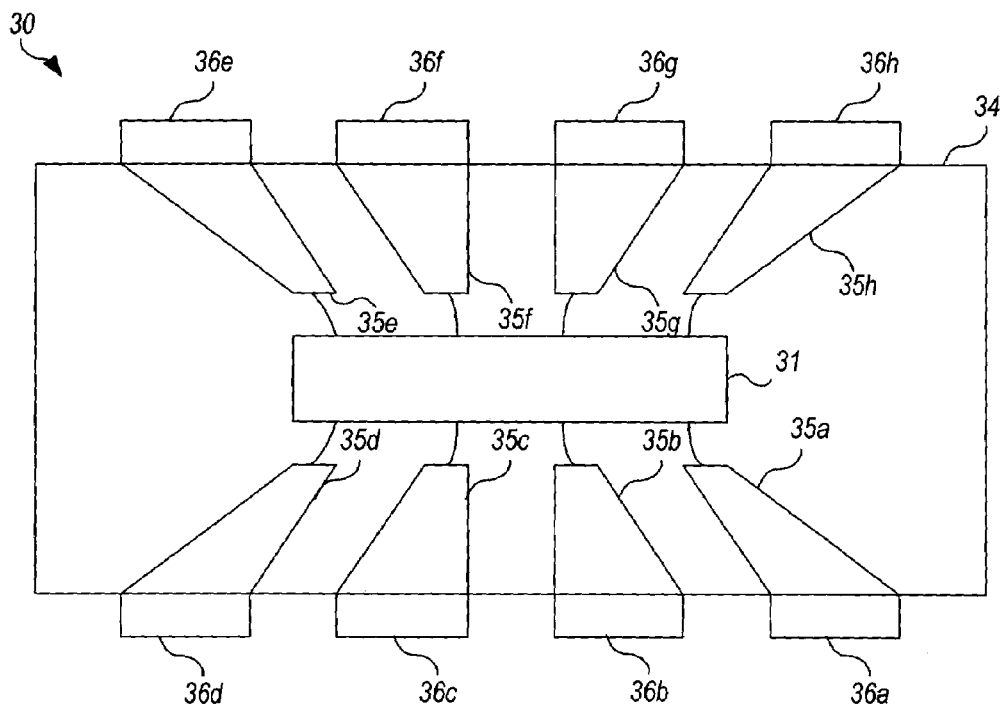
FIG. 3 is a top cutaway view of an integrated circuit chip.

FIG. 3 shows a top cutaway view of the integrated circuit chip 30. As illustrated, the integrated circuit chip 30 comprises an integrated circuit 31 packaged in an integrated circuit package 34. The integrated circuit 31 includes signal pads that must be made available outside of the integrated circuit package 34. Therefore, each pin 36a, 36b, 36c, 36d, 36e, 36f, 36g, 36h is connected to an internal lead conductor 35a, 35b, 35c, 35d, 35e, 35f, 35g, 35h which connects the pin 36a, 36b, 36c, 36d, 36e, 36f, 36g, 36h to a location just adjacent the integrated circuit 31. There, a small wire spans between each respective conductor 35a, 35b, 35c, 35d, 35e, 35f, 35g, 35h and its respective integrated circuit pad on the integrated circuit 31.

Figure 4:
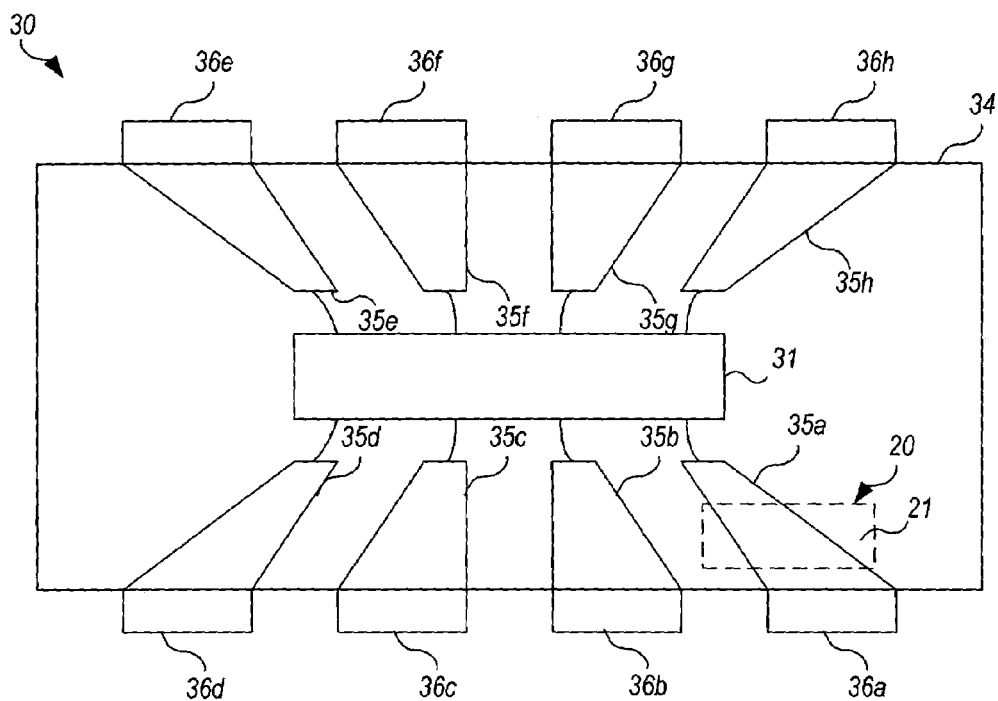
FIG. 4 is a top cut away view of the integrated circuit chip of FIG. 3 and a capacitive sensing probe.
Figure 5:
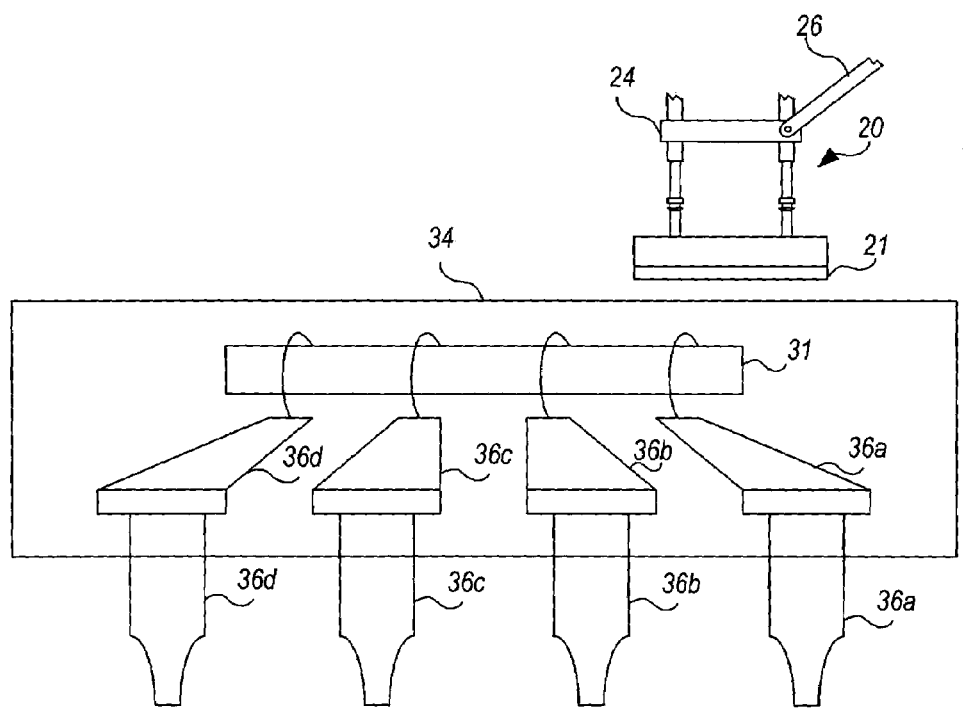
FIG. 5 is a side cut away view of the integrated circuit chip and capacitive sensing probe of FIG. 5.

FIG. 4 is a top cut away view, and FIG. 5 is a side cut away view, of the integrated circuit chip 30 and capacitive sensing probe 20 (indicated by dashed lines). One plate of the capacitor formed by the probe 20 is the probe electrode 21 (illustrated by dashed lines), here shown with probe electrode 21 positioned over the top of a respective internal lead conductor 35a. The other plate of the capacitor formed by the probe 20 is the internal lead conductor 35a. Although the capacitor created between the probe electrode 21 and internal lead conductor 35a in this manner is small, it is sufficient to conduct a signal from the internal lead conductor 35a to the probe electrode 21.

The capacitive sensing probe 20 may be used in conjunction with a test robot (not shown) to test the connection of each lead conductor 35a, 35b, 35c, 35d, 35e, 35f, 35g, 35h of the integrated circuit chip 30 individually. For this implementation, the capacitive sensing probe 20 may include a support mechanism 24 (FIG. 5) to enable a mechanical arm 26 of the robot to grab the test probe. The robot is then programmed for the coordinates of each lead conductor 35a, 35b, 35c, 35d, 35e, 35f, 35g, 35h.

Figure 6:
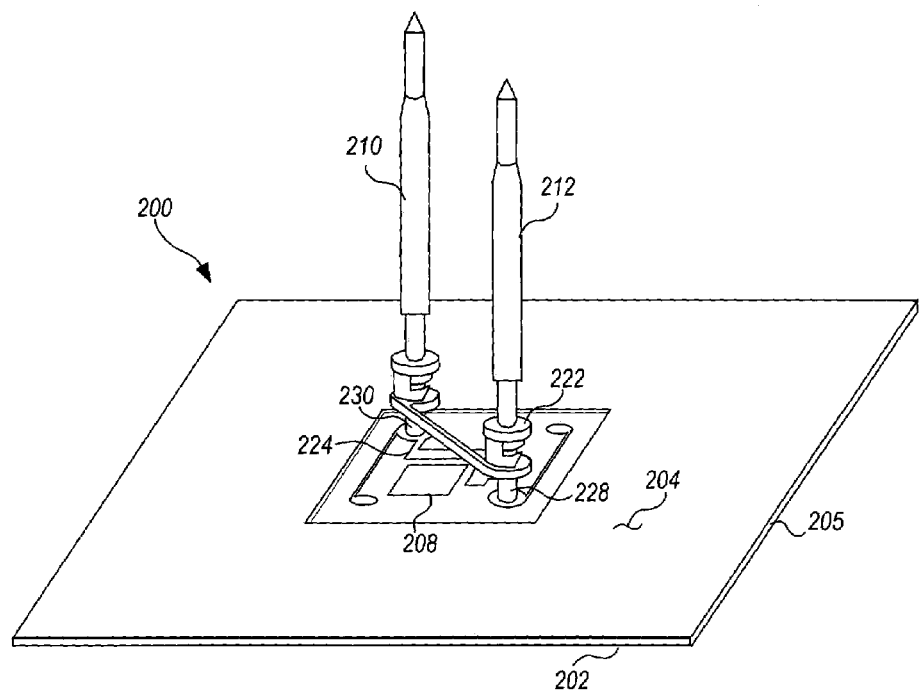
FIG. 6 is a top, front perspective view of an exemplary embodiment of a capacitive sensing probe.
Figure 7:
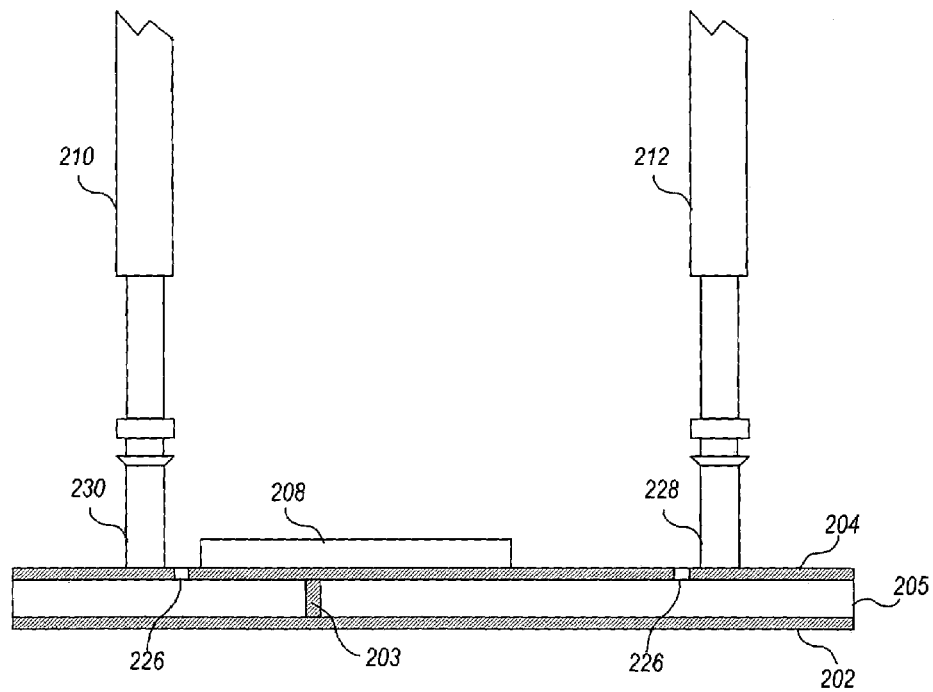
FIG. 7 shows a side cut-away view of the capacitive sensing probe of FIG. 6.

FIG. 6 is a top, front perspective view of an example capacitive sensing probe 200 and FIG. 7 shows a side cut-away view of the capacitive sensing probe 200 that may be used to implement the capacitive sensing probe 20. As shown in FIGS. 6 and 7, the capacitive sensing probe 200 includes a capacitive plate 202, a guard plate 204, an active buffer circuit 208, a guard electrode spring pin 201 and a signal electrode spring pin 212. The capacitive plate 202 and the guard plate 204 in the illustrative embodiment are preferably made of copper, but can be made of any electrically conductive material. The capacitive plate 202 and the guard plate 204 are separated by a dielectric 205, such as glass filled plastic or any other insulative material. The dielectric is approximately 0.04 inches thick. It should be understood that if the dielectric 205 is too thin, the capacitive reading will be distorted upward, and if the dielectric is too thick, the shielding effect of the guard plate will be reduced and stray system capacitance will be detected. The capacitive plate 202 in the present invention forms a capacitor with a conductive lead 35a–35h internal to the integrated circuit (see FIGS. 4 and 5). The capacitive plate 202 of the test probe 206 is electrically coupled to an active buffer circuit 208, which is located on the top surface of the dielectric and surrounded by the guard plate 204. The capacitive plate 202 is connected to the buffer circuit 208 at a location 203 (see FIG. 7). The amplification of the signal by the buffer circuit 208 which is in close proximity to the capacitive plate 202 where the signal is received helps to significantly optimize the signal to noise ratio, thereby decreasing the effect of system noise and stray capacitance. However, this can be accomplished by other means such as shielding by means of a coaxial cable or a conductive foam surrounding the spring pins 210 and 212.

During manufacturing, the dielectric 205 is deposited on the capacitive plate 202 and then the guard plate 204 is deposited on the dielectric. Next, the guard plate is etched down to the dielectric 205 to form traces for a buffer circuit 208 and a groove 226 is etched all the way around the buffer circuit area to electrically isolate the buffer circuit from the guard plate. During manufacturing, the buffer circuit 208 is mounted to the traces formed from the guard plate by using a chip on board procedure. The buffer circuit is electrically connected by a pin in socket connector 228 to a standard signal electrode spring pin 212, which acts as an electrical coupling means to a measuring device. The guard plate 204 is electrically connected via connector 230 to a guard electrode spring pin 210, which electrically couples the guard plate to system ground or a controlled voltage source.

Spring pins 210 and 212 give the test probe z-axis travel, which allows for intimate coupling with the integrated circuit component to be tested, regardless of the height of the component. Also, when the invention is used to test an entire circuit board, as in FIG. 17, the z-axis travel of the spring pins permit all of the test probes 206 to intimately contact the corresponding components, even if the heights of the components are not uniform. This z-axis travel can be accomplished by other means such as hydraulic pins with z-axis travel. Moreover, the z-axis travel is not necessary, as long as the test probe is a predetermined distance from the integrated circuit package so that there is a predetermined range of results.

The spring pins 210 and 212 are attached to standard connectors 228 and 230 via pin in socket coupling. The connectors 228 and 230 are soldered to the buffer circuit 208 and to the guard plate 204, respectively. The pin in socket coupling between the spring pins and the connectors is flexible enough to create a slight x,y plane swivel, which allows the test probe 206 to conform to the top surface of the integrated circuit to be tested, if the bottom surface of the test probe 206 is angularly offset from the top surface of the integrated circuit component, thus allowing a substantially uniform distance to be maintained between the test probe 206 and the integrated circuit package 34.

FIG. 8 describes the steps involved in performing a test for detecting open or sub-specification conditions along a net 42a and/or between the net 42a and pin 36a. As illustrated therein, to perform a test, the digital source 40 is connected in a step 101 to a first end 41a of a net 42a of interest. If the net 42a is electrically intact and conductively connected to pin 36a at the second end 43a of the net 42a, full conductive continuity along the net 42a should exist and should generate a predetermined capacitively coupled signal level when the capacitive coupling probe 20 is placed within a predetermined proximity to the respective internal lead conductor 35a of the integrated circuit package 34.

In a step 102, the first end 41a of the net 42a is stimulated with an oscillating digital reference signal 27 by the digital source 40. Capacitive sensing probe 20 then senses a signal from the second end 43a of the net 42a. In the illustrative embodiment, integrated circuit pin 36a should be connected to the second end 43a of the net 42a. If the net 42a between the digital source 40 at end 41a and the integrated circuit pin 36a at second end 43a is electrically intact and conductively connected to the integrated circuit pin 36a, the digital signal present on the integrated circuit pin 36a will be present on the internal lead conductor 35a, which will be capacitively coupled through the integrated circuit package 34 to the capacitive sensing probe 20. Thus, the probe electrode 21 operates as one capacitive plate of the probe 20 and the internal lead conductor 35a operates as the other capacitive plate for the probe 20.

In step 104, the capacitively coupled signal 23 is digitally sampled to convert it from an analog signal to a digital signal 25. In the illustrative embodiment, an analog-to-digital (A/D) sampling circuit 50 receives the capacitively coupled signal 23 from the capacitive sensing probe 20 and converts it to a digital signal 25, preferably at a sampling rate of ten times (10×) the frequency of the digital source signal.

In step 105, the digital representation 25 of the capacitively coupled signal 23 is correlated with an expected digital signature 29 of the reference signal 27 (without specific phase information of the digital source signal 27). In the illustrative embodiment, a signal correlator 60 performs shift correlation on the digital representation 25 of the capacitively coupled signal 23 with the expected digital signature 29 of the reference signal 27. If the continuity of the net under test 42a is intact and conductively connected to pin 36a, the digital representation 25 of the capacitively coupled signal 23 will have a strong correlation with the expected digital signature 29 at some shift of the correlation. If the continuity of the net under test 42a is poor or open, the digital representation 25 of the capacitively coupled signal 23 will have little or no correlation with the expected digital signature 29 at any shift of the correlation.

Figure 9:
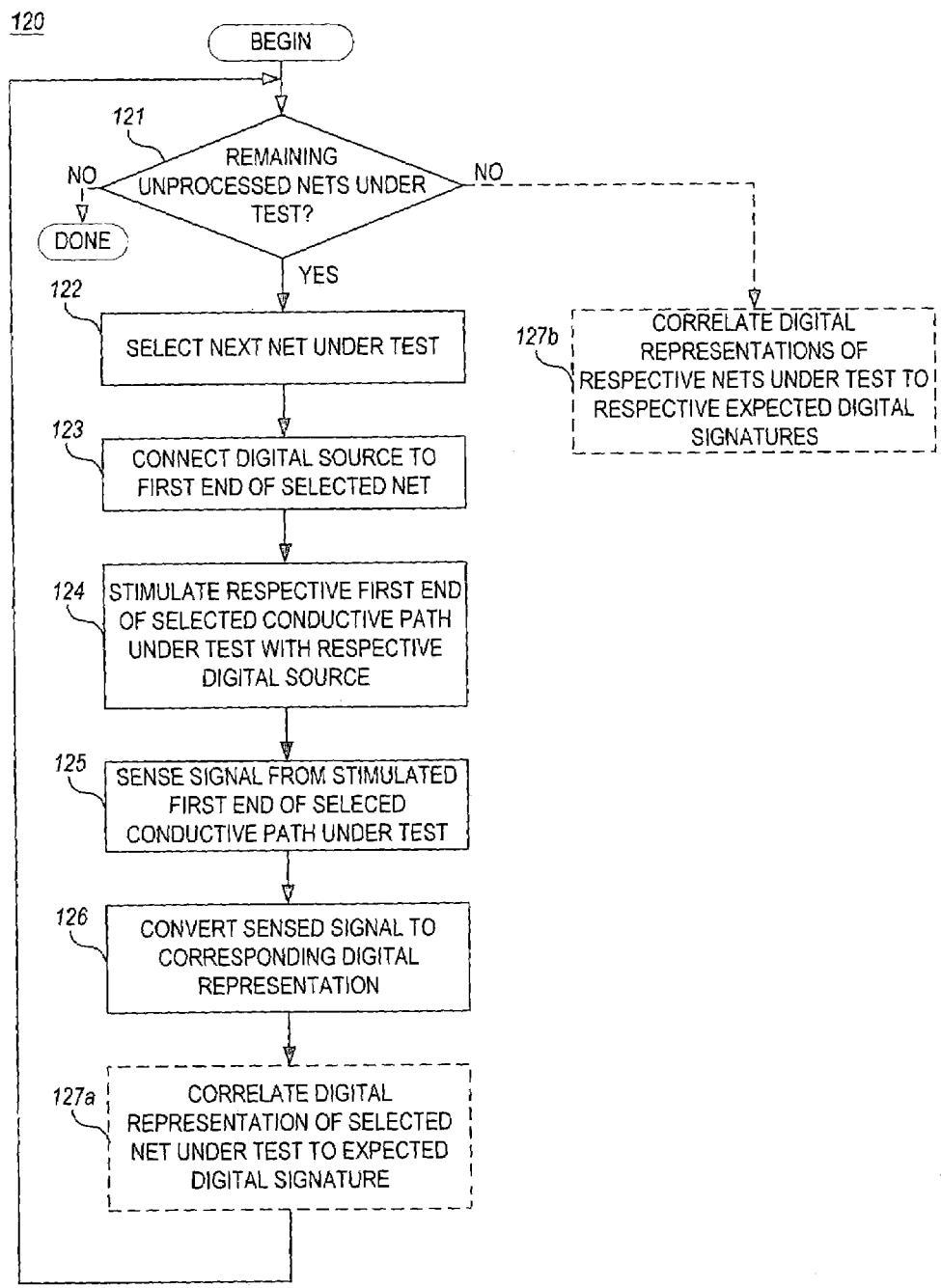
FIG. 9 is a flowchart illustrating an alternative method for performing a test for detecting open or sub-specification conditions of a net under test.

FIG. 9 describes one method 120 for performing a test for sequentially detecting open or sub-specification conditions of multiple nets 42a–42d of a circuit under test according to the embodiment of FIG. 2. As illustrated therein, to perform a test, the digital source 40 is connected in a step 121 to the first end 41a of a first net 42a to be tested. Because in this embodiment there is only one capacitive sensing probe 20 available to take the capacitively coupled signal measurements, the method 120 sequentially obtains the capacitively coupled signals from the respective internal lead conductors 35a–35d of the integrated circuit package 34. Accordingly, the method 120 makes a determination in step 121 as to whether there are any unprocessed nets 42a, 42b, 42c, 42d remaining to be processed. If so, in step 122 the next unprocessed net 42a, 42b, 42c, 42d is selected. In a step 123, the digital source 40 is connected to the first end 41a–41d of the selected net 42a, 42b, 42c, 42d. In a step 124, the first end 41a, 41b, 41c, 41d of the selected net 42a, 42b, 42c, 42d is stimulated by digital source 40. The capacitive sensing probe 20 then capacitively senses a signal from the internal lead conductor 35a, 35b, 35c, 35d that should be electrically connected to the selected net 42a, 42b, 42c, 42d through the package 34 in step 125. If the selected net 42a, 42b, 42c, 42d is electrically intact and electrically connected to its respective pin 36a, 36b, 36c, 36d, the digital oscillating signal present on the integrated circuit pin 36a, 36b, 36c, 36d will be capacitively coupled through the integrated circuit package 34 to the capacitive sensing probe 20.

In step 126, the sensed signal 23 is converted from an analog signal to a digital signal 25. In the illustrative embodiment, an analog-to-digital (A/D) sampling circuit 50 receives the capacitively coupled signal 23 sensed by the capacitive sensing probe 20 and converts it to a digital representation 25. Steps 122 through 126 are then repeated until measurements for each of the nets 42a, 42b, 42c, 42d of interest have been taken. The digital representation 25 of each capacitively coupled signal 23 is correlated by signal correlator 60 with its respective expected digital signature. This step may occur after each iteration of the loop (step 127a), or alternatively the digital representations 25 may be stored after each loop and then correlated after the digital representations of all nets of interest have been obtained (step 127b). If the continuity of a given net 42a, 42b, 42c, 42d is intact and conductively connected to its respective pin 36a, 36b, 36c, 36d, its corresponding extracted signal 25 will have a strong correlation with its expected digital signature at some shift of the correlation. If the continuity of a net 42a, 42b, 42c, 42d is poor or open, its corresponding extracted signal 25 will have little or no correlation with its expected digital signature at any shift of the correlation.

Figure 10:
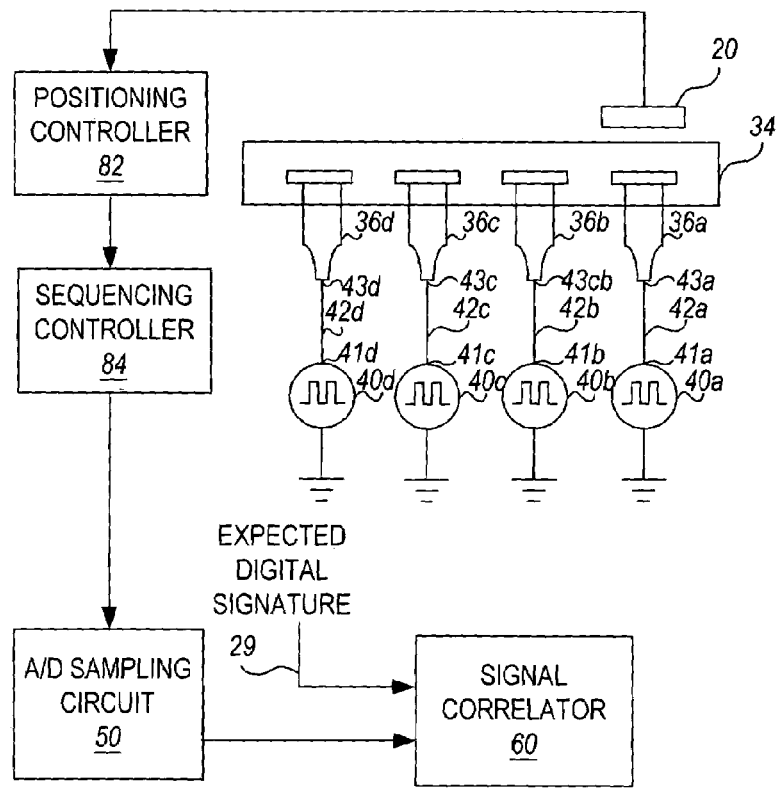
FIG. 10 is a schematic block diagram of a second embodiment test configuration for acquiring multiple capacitive sensor measurements implemented according to the invention.

FIG. 10 is a schematic block diagram of a second embodiment test configuration for acquiring multiple capacitive sensor measurements implemented according to the invention. In this configuration, multiple nets 45a, 45b, 45c, 45d of interest are tested. In the example shown, each net 45a, 45b, 45c, 45d (which may be a wire, a trace, a solder bump, or any other known conductive material, and/or combination thereof) is characterized by a first end 41a, 41a, 41b, 41c, 41d connected to the output of a respective oscillating digital source 40a, 40b, 40c, 40d, and a second end 43a, 43b, 43c, 43d connected to a respective integrated circuit pin 36a, 36b, 36c, 36d.

In the embodiment of FIG. 10, the area of the metallic electrode plate 21 of the capacitive sensing probe 20 is sized to cover only a portion of the conductor 35a, 35b, 35c, 35d, 35e, 35f, 35g, 35h connected to a single pin 36a, 36b, 36c, 36d, 36e, 36f, 36g, 36h of the integrated circuit package 34.

Figure 11:
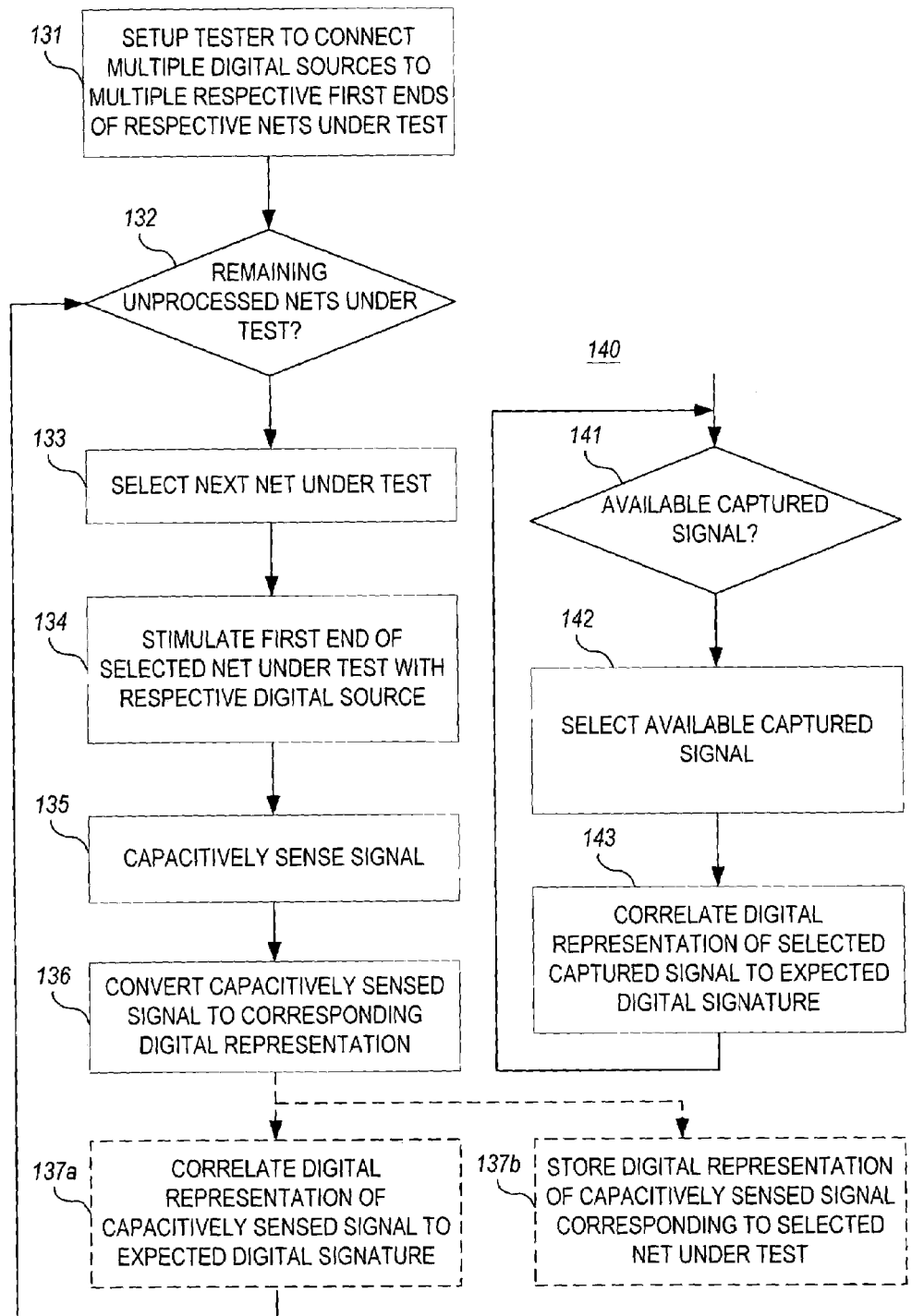
FIG. 11 is a flowchart illustrating another alternative method for performing a test for detecting open or sub-specification conditions of a net under test.

FIG. 11 shows a method 130 for performing a test for detecting open or sub-specification conditions of multiple nets 42a–42h of a circuit under test utilizing the configuration of FIG. 10. As illustrated in FIG. 11, to perform a test, respective digital sources 40a–40h are connected in a step 131 to respective first ends 41–41h of respective nets 42a–42h under test. Because in this embodiment there is only one capacitive sensing probe 20 available to take measurements on each of the respective nets 42a–42h, the method 130 obtains the signal samples sequentially. Accordingly, a determination is made in step 132 as to whether there are any unprocessed nets 42a–42h remaining to be processed. If there are any unprocessed nets 42a–42h, in step 133 the next unprocessed net 42a–42h is selected. In a step 134, the first end 41a–41h of the selected net 42a–42h is stimulated by its respective oscillating source 40a–40h. In step 135, the capacitive sensing probe 20 then capacitively senses a signal present on the respective internal lead conductor 35a–35h that should by design be connected to the first end 41a–41h of the selected net 42a–42h through the package 34. If the respective net 42a–42h is electrically intact and electrically connected to its respective pin 36a–36h, the digital signal present on that respective pin 36a–36h will be capacitively coupled through the integrated circuit package 34 to the capacitive sensing probe 20. In step 136, the sensed signal 23 is converted from an analog signal to a digital signal 25. In the illustrative embodiment, an analog-to-digital (A/D) sampling circuit 50 receives the respective capacitively coupled signal 23 sensed by the capacitive sensing probe 20 and converts it to a digital representation 25. Steps 132 through 136 are then repeated for all nets 42a–42h of interest. The digital representation 25 of each capacitively coupled signal 23 is correlated by signal correlator 60 with its respective expected digital signature. This step may occur after each iteration of the loop (step 137a), or alternatively the digital representations 25 may be stored after each loop and then correlated after the digital representations of all nets of interest have been obtained (step 137b). If the continuity of a given net 42a, 42b, 42c, 42d is intact and conductively connected to its respective pin 36a, 36b, 36c, 36d, its corresponding extracted signal 25 will have a strong correlation with its expected digital signature at some shift of the correlation. If the continuity of a net 42a, 42b, 42c, 42d is poor or open, its corresponding extracted signal 25 will have little or no correlation with its expected digital signature at any shift of the correlation.

Figure 12:
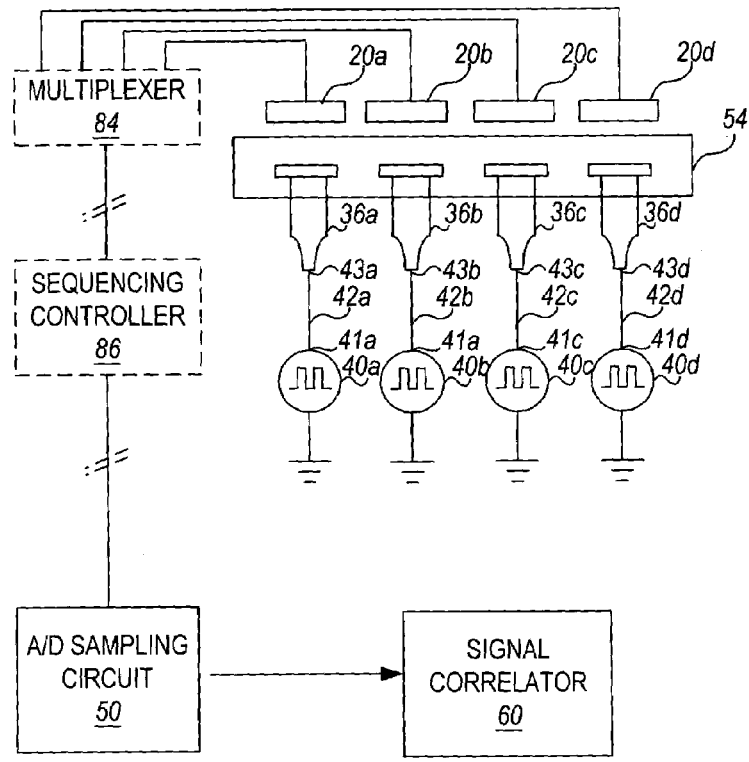
FIG. 12 is a schematic block diagram of a third embodiment test configuration for acquiring multiple capacitive sensor measurements implemented according to the invention.

FIG. 12 is a schematic block diagram of a third embodiment test configuration for acquiring multiple capacitive sensor measurements implemented according to the invention. In this configuration, multiple nets 42a–42h of interest are tested. In the example shown, each net 42a–42h (which may be a wire, a trace, a solder bump, or any other known conductive material, and/or combination thereof) is characterized by a first end 41a–41h respectively connected to the output of a respective oscillating digital source 40a–40h, and a second end 43a–43h respectively connected to a respective integrated circuit pin 36a–36h.

Figure 13:
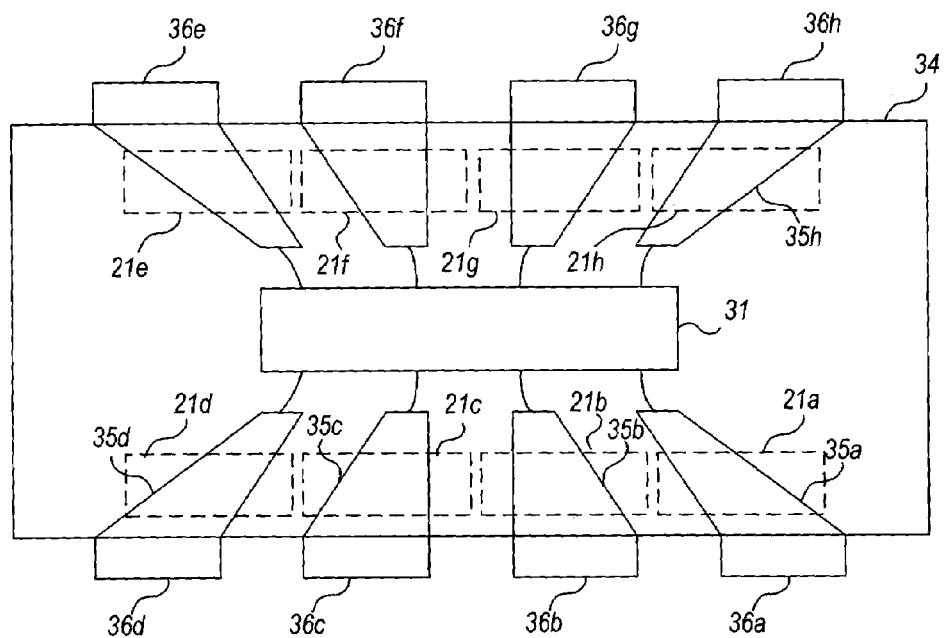
FIG. 13 is a top cutaway view of the integrated circuit chip and capacitive sensing probes of FIG. 12.

FIG. 13 shows a top cutaway view of the integrated circuit chip 30 and capacitive sensing probes 20a–20h of FIG. 12 (indicated by dashed lines). As illustrated, a different respective capacitive sensing probe 20a, 20b, 20c, 20d, 20e, 20f, 20g, 20h is respectively aligned over a different respective internal lead conductor 35a, 35b, 35c, 35d, 35e, 35f, 35g, 35h of the integrated circuit chip 30. The area of the metallic electrode plate of each capacitive sensing probe 20a, 20b, 20c, 20d, 20e, 20f, 20g, 20h is sized to cover only a portion of its respective conductor 35a, 35b, 35c, 35d, 35e, 35f, 35g, 35h so as not to overlap onto neighboring conductors 35a, 35b, 35c, 35d, 35e, 35f, 35g, 35h.

In the embodiment shown in FIGS. 12 and 13, a different respective capacitive sensing probe 20a–20h capacitively senses a separate signal from each respective conductor 35a–35h. These signals can be returned to the signal processing circuitry in parallel, or alternatively can be collected sequentially through the use of a multiplexer 86 and sequencing controller 84 (shown in dashed lines in FIG. 12).

FIG. 14 illustrates a method 110 for performing a test for detecting open or sub-specification conditions of multiple nets 42a–42d of a circuit under test utilizing the configuration of FIG. 12 when the capacitively sensed signals are collected in parallel. As illustrated in FIG. 14, to perform a test, each digital source 40a–40d is connected in a step 111 to a respective first end 41a–41d of its respective net 42a–42d. In a step 112, the respective first end 41a–41d are stimulated by respective digital sources 40a–40d. Respective capacitive sensing probes 20a–20d then each sense a signal from the respective second end 46a–46d of its respective net 42a–42d. In step 104, the respective sensed signals are each converted from a respective analog signal to a respective digital signal. In step 115, each respective digital representation of the respective sensed signals is correlated with a respective expected digital signature. If the continuity of the respective net under test is intact, the respective extracted signal will have a strong correlation with its respective expected digital signature at some shift of the correlation. If the continuity of the respective net under test is poor or open, the respective extracted signal will have little or no correlation with its respective expected digital signature at any shift of the correlation. It is to be understood that depending on the implementation, the signal conversion and processing can be performed in parallel or in serial.

Figure 15:
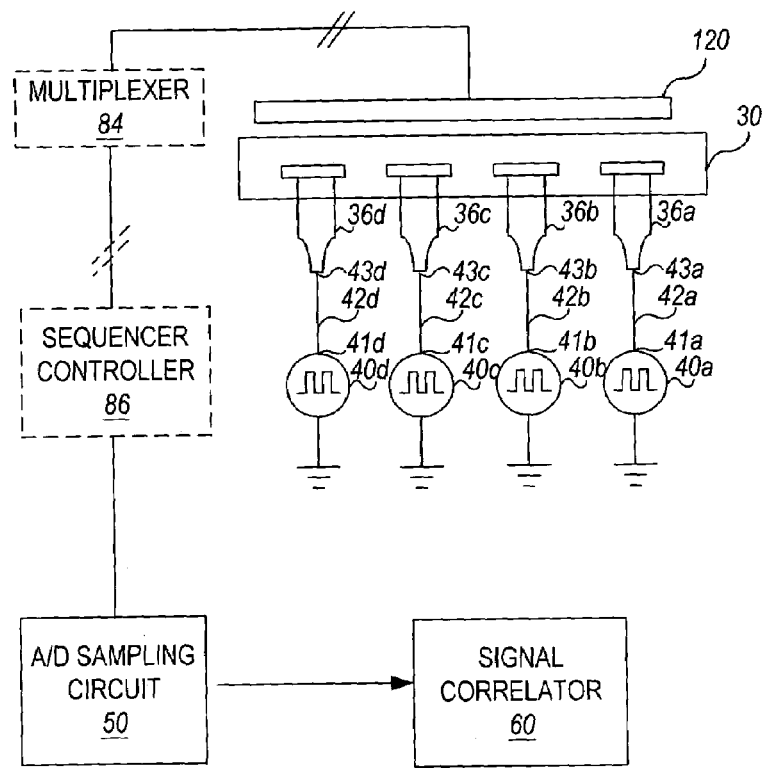
FIG. 15 is a schematic block diagram of a fourth embodiment test configuration for acquiring multiple capacitive sensor measurements implemented according to the invention.
Figure 16:
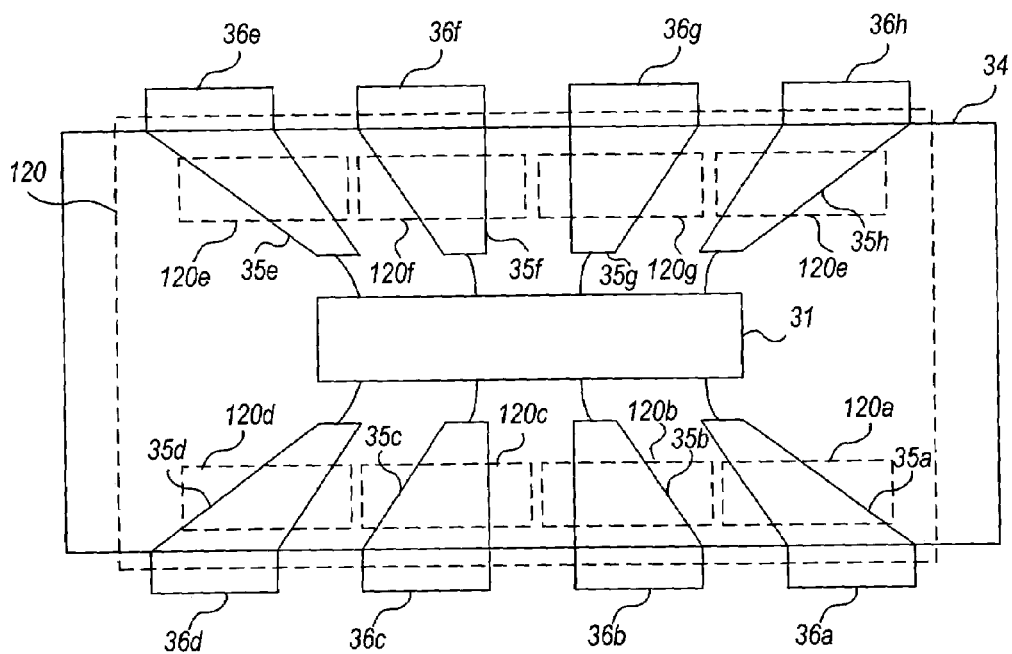
FIG. 16 is a top cutaway view of the integrated circuit chip and capacitive sensing probes of FIG. 15.

FIG. 15 is a schematic block diagram of a fourth embodiment test configuration for acquiring multiple capacitive sensor measurements implemented according to the invention, and FIG. 16 is a top cutaway view of the integrated circuit chip 30 and a segmented capacitive sensing probe 120, indicated by dashed lines. In this embodiment, the segmented capacitive sensing probe 120 comprises a plurality of individual probe plates 120a, 120b, 120c, 120d, 120e, 120f, 120g, 120h, indicated in FIG. 16 by dashed lines, each of which is aligned over a single internal lead conductor 35a, 35b, 35c, 35d, 35e, 35f, 35g, 35h in the integrated circuit chip 30 when the segmented capacitive sensing probe 120 is aligned over the integrated circuit package 34. The area of each individual probe plate 120a, 120b, 120c, 120d, 120e, 120f, 120g, 120h is sized to cover only a portion of its respective conductor 35a, 35b, 35c, 35d, 35e, 35f, 35g, 35h so as not to overlap onto neighboring conductors 35a, 35b, 35c, 35d, 35e, 35f, 35g, 35h and to allow each individual probe plate 120a, 120b, 120c, 120d, 120e, 120f, 120g, 120h to separately sense a signal from its respective conductor 35a, 35b, 35c, 35d, 35e, 35f, 35g, 35h. The leads of the individual probe plates 120a, 120b, 120c, 120d, 120e, 120f, 120g, 120h may be connected to the signal processing circuitry 50, 60 in parallel to allow the signals to be processed in parallel. Alternatively, the leads of the individual probe plates 120a, 120b, 120c, 120d, 120e, 120f, 120g, 120h may be connected to a multiplexer 84 that is controlled by a sequencing controller 86, as shown in dashed lines, and the signals are collected one at a time (i.e., serially).

When capacitively sensed measurements in the embodiment of FIGS. 15 and 16 are collected in parallel, the method described in FIG. 14 may be followed to perform a test for detecting open conditions or sub-specification electrical connections on the circuit under test. When capacitively sensed measurements in the embodiment of FIGS. 15 and 16 are collected serially, the method described in FIG. 11 may be followed to perform the test.

The results of correlation may be used in various ways. For example, a basic go/no-go test may be performed to determine whether an open circuit exists on a net. An open exists if the correlator 60 finds no correlation with the expected digital signature. However, even if some correlation exists, indicating that the net does not have a complete open, the electrical integrity of the net may not be sufficient to meet the specifications of the circuit. For example, if the net comprises a printed circuit board trace, and the trace, for whatever reason, is very thin somewhere along the path, while technically net would not be characterized by an open, the amount of current the trace can conduct may be limited due to the "thin area" of the trace such that the current drive of the trace does not meet the board specifications. Accordingly, the strength of the correlation detected by the correlator 60 may be compared to a minimum correlation strength threshold to determine whether the net meets minimum conductive integrity requirements. Accordingly, the results of the correlator 60 may be utilized in various ways to meet the needs of the specific application.

Figure 17:
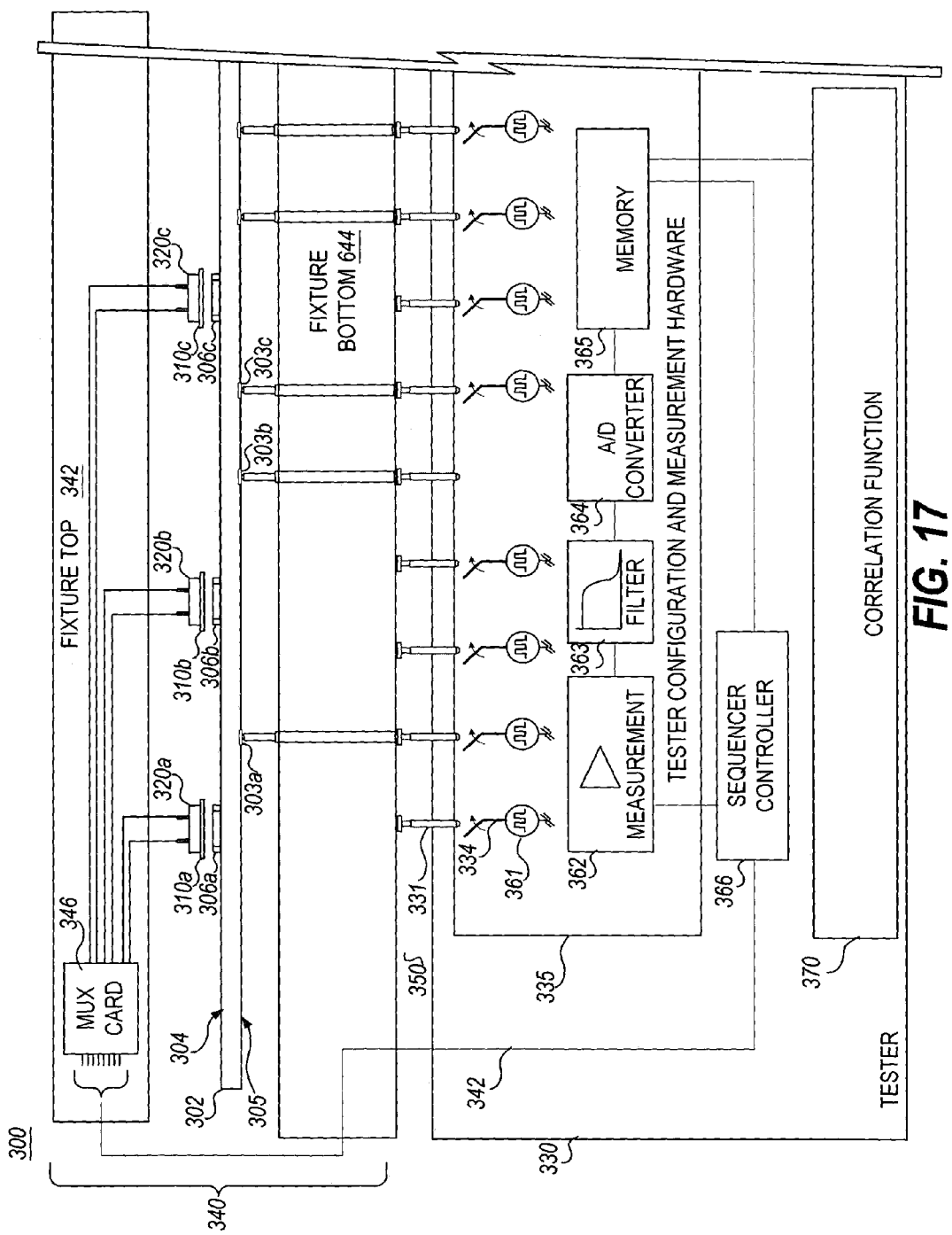
FIG. 17 is a schematic block diagram of a portion of an in-circuit test system employing the capacitive sensing techniques of the invention.

Turning now to consider the use of the invention in mass production printed circuit board (PCB) assembly and testing, there is shown in FIG. 17 a portion of an in-circuit test system 300 employing, for illustrative non-limiting purposes only, several capacitive coupling probes 320a, 320b, 320c implemented in accordance with the invention. As illustrated, the in-circuit test system 300 includes a tester 330 and a fixture 340 for seating a PCB under test 302. Due to the close spacing of the tester interface pins, nodes of the PCB under test, and small size of the components under test, only a small edge portion of the tester/fixture/PCB under test combination is shown for ease of illustration.

Tester 330 includes a plurality of tester interface pins 331 arranged in an array along the top side of the tester 330. Tester 330 includes tester hardware 335 to make or to not make electrical connections between digital sources 361 within the tester and the various tester interface pins 331. To this end, each tester interface pin 331 is connectable to or isolated from a digital source 361 by one or more corresponding relays 334.

Mounted on top of the tester 330 and over the tester interface pins 331 is the test fixture 340. The test fixture 340 interfaces the tester interface pins 331 to test access points 303a–303e on the PCB under test 302.

The fixture 340 is configured with a number of capacitive coupling probes 320a, 320b, 320c. For convenience of illustration and clarity of the invention, only three such capacitive coupling probes 320a, 320b, 320c are shown; however, it will be appreciated by those skilled in the art that a conventional in-circuit tester may have many more such probes. In the illustrative embodiment, the probes 320a, 320b, 320c are mounted to the fixture top 342 such that the capacitive plate 310a, 310b, 310c of each apparatus 320a, 320b, 320c precisely aligns over its corresponding component under test 306a, 306b, 306c when the PCB 302 is properly mounted in the fixture 340.

In the preferred embodiment, the fixture 340 may include one capacitive coupling probe 320 for each integrated circuit, capacitor, resistor, or other component of interest on the printed circuit board 302. Accordingly, a large number of capacitive coupling probes 320 may be required. For this reason, it may be desirable to multiplex the control signals and analog response signals 342 going between the tester and the capacitive coupling probes 320a–320c to reduce the number of wires between the tester 330 and fixture 340.

The capacitive coupling probes 320a, 320b, 320c are used to perform in-circuit capacitive measurement tests. An example of a capacitive sensing probes ideal for use in the present invention is Agilent Technology's TestJet™ probe, which is described in detail in U.S. Pat. No. 5,254,953 to Crook et al., U.S. Pat. No. 5,241,336 to Crook et al., U.S. Pat. No. 5,498,964 to Kerschner et al., U.S. Pat. No. 5,357,209 to Crook et al., and U.S. Pat. No. 5,696,431 to Keirn et al.

When an in-circuit capacitive measurement test is to be executed, the configuration hardware 335 configures the relays 334 such that digital sources 361 are electrically connected to respective tester interface pins 331 that electrically connect through the fixture 340 to the test access points 303a–303c on the bottom side 305 of the PCB under test 302. The capacitive coupling probes 320a–320c are positioned over components under test. The capacitive coupling probes 320a–320c are used to determine whether the nets between the test access point structures 303a–303c and a respective component under test on the PCB 302 are electrically intact. The sequencer controller 366 enables the digital sources 361 to begin stimulating their respective test access points 303a–303c. The sequencer controller 366 configures the multiplexer card 346 to route capacitively sensed signals from the respective capacitive sensing probes 320a–320c to the tester 330 according to a predetermined order. As the capacitively coupled signals are received back from the probes 320a–320c, measurement circuitry 362 acquires the signals and passes them through an anti-aliasing filter 363 prior to analog-to-digital conversion by A/D converter 364. Each of the converted digital measurements are preferably stored in a respective designated area 365a, 365b, 365n in memory 365.

A correlation function 340 operates to correlate each of the stored converted digital measurements in memory 365 with expected digital signatures for those measurements.

In each of the above embodiments, the method of correlation depends on the type of reference signal 27, or "stimulus", generated by the digital source 40. The stimulus 27 may be either a square-wave stimulus or a coded pulse-train stimulus.

If the stimulus 27 is a square-wave stimulus, then correlation of the digital representation 25 of the captured capacitively coupled signal 23 with the expected digital signature of the stimulus is preferably achieved using cross-correlation. In the cross-correlation method, the signal used for stimulus is a simple square wave or pulse train. The time ordered measurements taken by the A/D converter are multiplied by a time ordered mathematical representation of the square-wave stimulus (i.e. +1 or −1). Correlation is the normalized sum of all these measurements. This type of correlation function is called cross-correlation. Cross-correlation is a well-known technique in communications. It is used widely in spread spectrum systems where an information signal is spread over a wide frequency band to form a spread spectrum signal, transmitted as a spread spectrum signal, and recovered by remapping the received spread spectrum signal into the original information bandwidth. The information to be transmitted, (i.e., the stimulus signal) may be embedded in the spread spectrum signal according to several methods. These methods are described in Dixon, R. C., "Spread Spectrum Systems", Wiley-Interscience, 1976, which is incorporated herein by reference for all that it teaches.

In one embodiment, if the stimulus 27 is a square-wave stimulus, the correlation function 60 correlates the capacitively coupled signal 23 with phase (i.e., time) shifted representations of the square wave stimulus signal 27. The correlation function 60 then performs a search to determine the phase at which the magnitude of the correlation function peaks. This peak magnitude will be linearly related to the amount of coupling between the stimulus probe and the capacitive sensing probe. It will be compared to a threshold value in order to determine the presence or absence of an electrical connection between the stimulating node and the lead frame of the tested IC.

Figure 18:
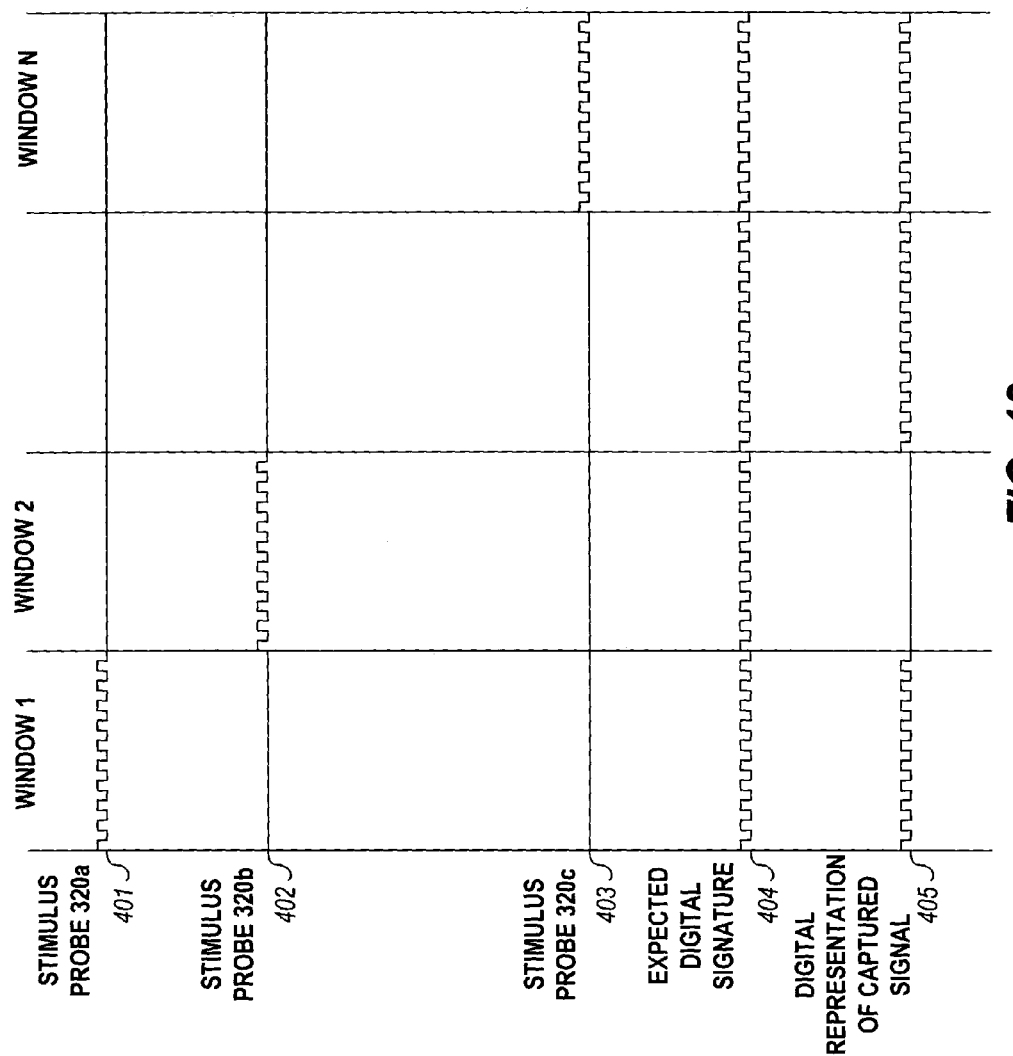
FIG. 18 is a waveform diagram illustrating example waveforms for the system of FIG. 17.

FIG. 18 is a waveform diagram illustrating example capacitively coupled signal waveforms 401, 402, 403 and corresponding expected digital signature waveform 404 and digital representation waveform 405 acquired when the stimulus is a square-wave stimulus. For example, in the embodiment of FIG. 17, the digital sources 361 may be synchronized to output an identical square wave signal, shown as waveform 404. Waveforms 401, 402, and 403 may for example correspond to capacitively coupled signals collected by each of probes 320a, 320b, and 320c. Waveform 405 illustrates the sequential digital representation of the capacitively sensed signals received by each of probes 320a, 320b, and 320c. As illustrated, the digital representation of the capacitively sensed signals received by each of probes 320a, and 320c match the expected digital signature (i.e., the waveform matches the input at some shift of correlation). The digital representation of the capacitively sensed signal collected by probe 320b, however, does not match the expected digital signature. The correlation function 340 will therefore be unable to correlate the measurement with its expected digital signature, indicating an open connection on the component probed by probe 320b.

In an alternative embodiment, the capacitively coupled signal may be correlated with itself. This is referred to as auto-correlation. In this approach, since the rate at which the stimulus waveform (straight frequency, chirp signal, or other repeats is known, the period of the stimulus signal is known. The auto-correlation algorithm will detect correlations as the data is shifted across itself at the frequency of the period of the stimulus signal.

In particular, in an example embodiment, the auto-correlation algorithm searches for multiple correlations (e.g., 10–20 or more) spaced apart at the "expected" stimulus frequency.

It should be noted that when using auto-correlation, some cautionary measures should be taken to ensure that the correlated signal is that of the capacitively coupled signal measurement and not spurious noise. As known in the art, any repetitive signal at any frequency (i.e., not just the pulse train and not just the stimulus frequency) that is present at the input of the A/D converter will correlate with itself. The classic example of repetitive spurious noise is line frequency noise (60 Hz). Thus, if such a signal is present, it may mask any absence of the capacitively coupled stimulus signal without additional measures taken. For example, if the noise included an embedded 60 Hz signal and the "expected" or repeated stimulus was 100 kHz, then the algorithm would see correlations at 60 Hz and at 100 kHz. However, since the period of the expected stimulus is known (100 kHz), the algorithm may simply be configured to discard detected correlations that do not have a spacing that represents the stimulus frequency of 100 kHz. Of course, if the noise is a multiple of the stimulus frequency (or repetition rate), then obviously, a simple solution is to use a different stimulus frequency. An algorithm could be implemented to send a stimulus frequency(s) at a frequency that is not related to any expected noise sources. One such implementation is the use of a "chirp" signal (i.e., a signal that increases in frequency over time) repeated many times that would not favor any one frequency. The correlation algorithm would see correlations at the rate (or spacing) of the repetition rate of the chirp signal.

The use of auto-correlation may be advantageous in systems where a lot of variation in the transfer functions through the probe plate of each of its capacitive coupling probes exists. A cross-correlation algorithm requires the "expected" signal used the in cross-correlation algorithm to be a "typical" transfer function through the sensor plate. Since auto-correlation does not need to generate an "expected" signal to correlate (since the signal is simply correlated with itself, the differences in the transfer function variation between the various plates, integrated circuits, and different assemblies is irrelevant.

In the preferred embodiment, the stimulus 27 is a coded pulse-train sequence. If the stimulus 27 is a coded pulse-train sequence, then correlation of the digital representation 25 of the captured capacitively coupled signal 23 with the expected digital signature of the stimulus is performed using cross-correlation. The signal processing is similar to that for processing the square-wave except that the search for a peak correlation response must occur over the length of the code sequence. The search must find not only the relative phase between the source and detected signals; it must also find the relative timing in the code sequence. Since the amount of shift from the stimulus 27 to the capacitively sensed signal 23 is well bounded (stimulus-to-detection delay≦to one bit length), this timing is relatively easy to recover.

The use of a coded pulse-train sequence as the stimulus 27 offers several advantages. First, the coded pulse-train sequence technique rejects spurious signals at the clock frequency of the pulse train. Only a signal that correlates with both the clock frequency and the code sequence will generate a response.

Another advantage is that the code sequence technique allows multiple stimulus signals to be used at the same time—even when detected with the same sensor. By using code sequences that are orthogonal to each other (have a correlation of 0), the post acquisition processing can look for multiple independent responses corresponding to the different codes. The ability for parallel testing provides an obvious advantage in speed over the square-wave method.

When using a coded pulse-train sequence as the stimulus 27, the system preferably utilizes a well-known modulation technique known as direct sequence modulation. This technique is described in detail in Dixon, R. C., "Spread Spectrum Systems", Wiley-Interscience, 1976, pp. 1–27; supra. In a preferred embodiment, the tester 300 would use direct sequence modulation as described therein.

Figure 19:
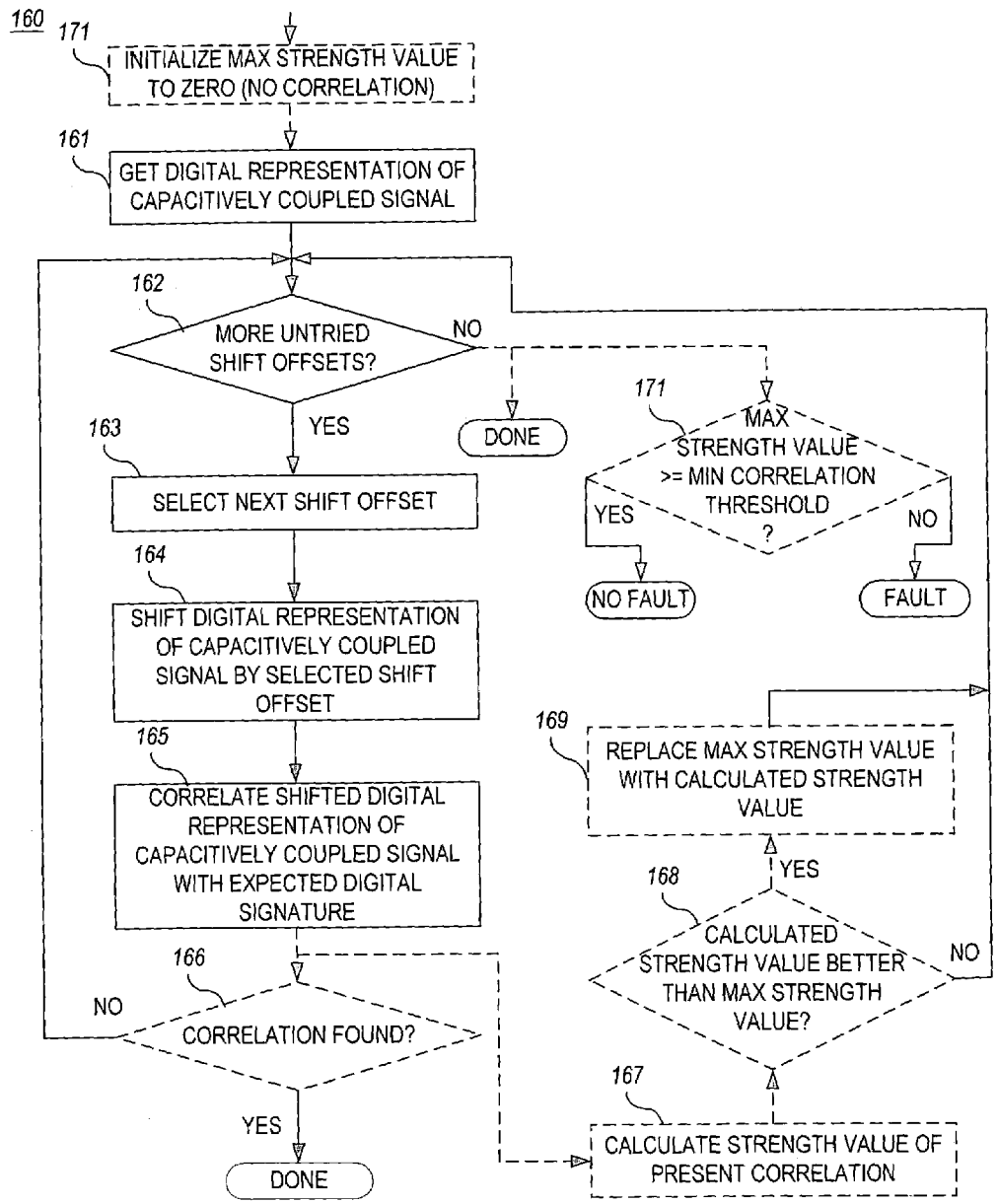
FIG. 19 is a flowchart illustrating an exemplary method for correlating a digital representation of a capacitively sensed signal with an expected digital signature without the use of phase information.

FIG. 19 is a flowchart illustrating an example general correlation algorithm 160 that may be implemented by the signal correlator 60 in the embodiments of FIGS. 2, 10, 12, or 15, or correlation function 370 of FIG. 17. In a step 161, the algorithm 160 receives a digital representation 25 of a capacitively coupled signal 23 recovered by a probe 20, 320a–320c. The algorithm 160 sequences through a set of offsets, attempting to correlate the retrieved digital representation 25 of a capacitively coupled signal 23 with an expected digital signature. To this end, the algorithm 160 determines in step 162 whether existing shift offsets remain to be processed. If so, an unprocessed shift offset is selected in step 163, and the retrieved digital representation 25 of the capacitively coupled signal 23 is shifted by the selected shift offset in step 164. The algorithm 160 attempts to correlate the shifted digital representation of the capacitively coupled signal with the expected digital signature in step 165. If correlation no is found, as determined in step 166, steps 162 through 166 are repeated until either correlation is found, or all shift offsets have been processed. If correlation is found in step 166, the algorithm 160 may terminate, as in a go/no-go test.

Alternatively, as indicated by the steps 167 through 171, the strength of the correlation may be determined and used to find the level of the maximum strength correlation level. In this embodiment, a maximum strength value is initialized to zero in step 170 prior to the processing of the digital representation 25 of a capacitively coupled signal 23 in steps 162 through 166. Then, when a correlation is found, as determined in step 166, the strength of the correlation is calculated in step 167. The calculated strength value is greater than the present maximum strength value, as determined in step 168, the present maximum strength value is replaced with the calculated strength value in step 169. Steps 167 through 169 are repeated at the end of each iteration of the loop (steps 162 through 165). When all shift offsets have been processed, the maximum strength value contains the peak correlation magnitude found. The peak correlation magnitude may be compared to a predetermined minimum correlation threshold in a step 171, from which a determination may be made in step 172 as to the integrity of the connection associated with the processed capacitively coupled signal.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. An electrical integrity testing apparatus for testing electrical integrity of nets on a circuit under test, comprising:
    a stimulating probe couplable to a first end of a net of interest on said circuit under test;
    a signal generator couplable to said stimulating probe operable to generate a known oscillating digital reference signal;
    a capacitive sensing probe operable to capacitively couple a signal from a second end of said net of interest when said known oscillating digital reference signal stimulates said first end of said net of interest; and
    a signal correlator which performs signal correlation on a digital representation of said capacitively coupled signal with said known oscillating digital reference signal based only on said capacitively coupled signal and an expected digital signature of said known oscillating digital reference signal, said signal correlation indicating whether an open defect exists on the net of interest.

2. An apparatus in accordance with claim 1, comprising:
    a classification function responsive to correlation results generated by said signal correlator to classify said net of interest into one of a plurality of different levels of conductive integrity.

3. An apparatus in accordance with claim 1, further comprising:
    a filter which filters signal components from said capacitively coupled signal outside a predetermined frequency range, said predetermined frequency range comprising at least a range of frequencies of said known oscillating digital reference signal.

4. An apparatus in accordance with claim 1, wherein said known oscillating digital reference signal comprises a coded pulse-train sequence and said signal correlation comprises cross-correlation of said digital representation of said capacitively coupled signal with an expected digital signature of said coded pulse-train sequence.

5. An apparatus in accordance with claim 1, wherein said known oscillating digital reference signal comprises a square-wave pulse train and said signal correlation comprises auto-correlation of said digital representation of said capacitively coupled signal with itself.

6. An apparatus in accordance with claim 1, wherein said known oscillating digital reference signal comprises a square-wave pulse train and said signal correlation comprises cross-correlation of said digital representation of said capacitively coupled signal with en expected digital signature of said square-wave pulse train.

* * * * *

UNITED STATES PATENT AND TRADEMARK OFFICE
CERTIFICATE OF CORRECTION

PATENT NO. : 6,998,849 B2 Page 1 of 1
APPLICATION NO. : 10/672804
DATED : February 14, 2006
INVENTOR(S) : Tesdahl et al It is certified that error appears in the above-identified patent and that said Letters Patent is hereby corrected as shown below:

In column 16, line 26, in Claim 6, delete "en" and insert -- an --, therefor.

Signed and Sealed this

Fourteenth Day of November, 2006

JON W. DUDAS
*Director of the United States Patent and Trademark Office*